Oct. 27, 1970 R. E. MYER 3,537,023
CLASS B TRANSISTOR POWER AMPLIFIER
Filed March 27, 1968 2 Sheets-Sheet 1

INVENTOR
R. E. MYER
BY
Walter M. Hill
ATTORNEY

United States Patent Office 3,537,023

Patented Oct. 27, 1970

3.537,023

CLASS B TRANSISTOR POWER AMPLIFIER

Robert E. Myer, Denville, N.J., assignor to Bell Telephone Laboratories, Incorporated, Murray Hill and Berkeley Heights, N.J., a corporation of New York Filed Mar. 27, 1968, Ser. No. 716,375
Int. Cl. H03f 3/18
U.S. Cl. 330—13 3 Claims

ABSTRACT OF THE DISCLOSURE

A class B transistor push-pull power amplifier comprising a driver stage and a power stage. Two complementary type transistors comprise the driver stage, each connected in grounded emitter configuration and having their collectors connected together through one or more diodes while their emitters are connected to a power source through resistors. The collectors are effectively direct coupled to the bases of a pair of power transistors in the power stage so that these bases are biased by the substantially constant voltage drop across the diodes in the driver stage to operate the power stage in the class B push-pull mode. Both direct current and alternating current feedback are employed. The coupling between the stages is such as to render the base emitter junctions of the power transistors essentially the sole effective load on the driver transistors.

BACKGROUND OF THE INVENTION

This invention relates to the amplifier art and more particularly to class B push-pull transistor power amplifiers.

Class B push-pull power amplifiers have been historically plagued with distortion caused by the nonlinear output current characteristic in the crossover region as one amplifier device ceases conduction and the other one starts to conduct. For many years the total harmonic distortion was considered satisfactory if it did not exceed about five percent, with the distortion usually increasing at low signal levels. Attempts to reduce this distortion resulted in rather complex and expensive circuits often requiring critical bias and balance adjustments. In recent years power transistors have been developed and have been used in class B circuits both with and without transformers. Although the circuits using transistors have been somewhat simplified in some respects, distortion, although reduced, has continued to exist in most cases. Moreover, many of these circuits did not achieve the efficiency of which transistors are capable, temperature stability has also continued to be a problem which always requires special attention and many circuits are critically sensitive to both power supply voltage and component tolerances. A more elaborate discussion of crossover distortion may be found in Transistors: Principles, Design and Applications, W. W. Gartner (1960), pp. 475–484.

SUMMARY OF THE INVENTION

The present invention comprises a class B transistor power amplifier circuit in which a driver stage has the collector electrodes of two complementary transistors directly connected through a diode. Two resistors, one connected to each emitter electrode, completes a series circuit through the transistors and a power source. The power stage comprises two transistors having their emitter-collector paths connected directly in series across the power source. The base electrodes of the power transistors are direct coupled to the collector electrodes of the driver stage transistors so that the voltage drop across the diode in the driver stage maintains a substantially constant bias voltage between the base electrodes of the two power transistors. The interstage coupling is such that the base-emitter junctions of the power transistors comprise essentially the sole load on the output circuits of the driver stage. The circuit employs both alternating current and direct current feedback. The alternating current feedback not only establishes the overall voltage gain and improves the linearity of class B operation but, most importantly, it causes the driver stage gain to increase greatly as the impedance of the base-emitter junctions become very large through the crossover region where one power transistor ceases to conduct and the other one starts conduction. This is a new mode of operation for class B amplifiers which virtually eliminates all distortion in the crossover region regardless of signal strength. The direct current feedback automatically centers the bias for the driver stage, renders the circuit highly stable during quiescent conditions and makes it tolerant to wide component and supply voltage variations.

BRIEF DESCRIPTION OF THE DRAWINGS

The invention may be better understood by reference to the accompanying drawings in which.

DETAILED DESCRIPTION

Figure 1:
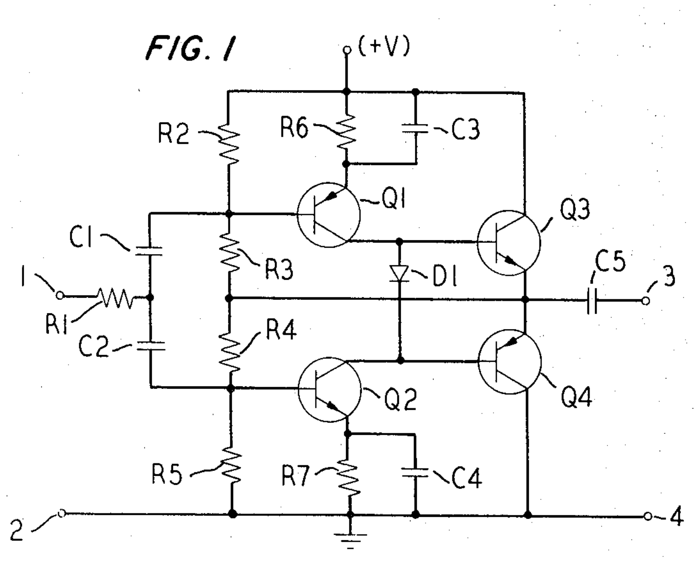
FIG. 1 discloses a circuit diagram of an amplifier circuit embodying the principles of this invention.

FIG. 1 discloses a two-stage amplifier biased for operation in the class B mode. The driver stage comprises transistors Q1 and Q2 while the power stage comprises transistors Q3 and Q4. The collector electrodes of the driver transistors Q1 and Q2 are preferably directly connected together by a diode D1, although a diode is not essential to successful operation. Resistor R6 connects the emitter electrode of transistor Q1 to the positive pole (+V) of a direct current power source while resistor R7 connects the emitter electrode of transistor Q2 to the grounded pole of the same source. Capacitors C3 and C4 shunt resistors R6 and R7, respectively, to bypass signal currents. A potential divider comprising resistors R2, R3, R4 and R5 is connected across the two poles of the same power source. The junction between resistors R2 and R3 is connected to the base electrode of transistor Q1 while the base electrode of transistor Q2 is connected to the junction between resistors R4 and R5. The input circuit to the amplifier comprises signal input terminal 1 and grounded terminal 2. The signal input terminal 1 is coupled to the base electrodes of both of the driver transistors by way of resistor R1 and capacitors C1 and C2 so that both transistors receive the same signal voltage.

The base electrodes of power transistors Q3 and Q4 are directly connected, respectively, to the collector electrodes of driver transistors Q1 and Q2 while the emitter electrodes of these two transistors are connected together and coupled to the signal output terminal 3 by way of capacitor C5. The collector electrode of transistor Q3 is connected directly to the positive pole of the power source while the collector electrode of transistor Q4 is directly connected to the grounded negative terminal of the same power source.

For the sake of symmetry, resistors R2 and R5 are made equal, resistors R3 and R4 are made equal and resistors R6 and R7 are made equal, although exact equality is not essential and only nominal values with twenty percent tolerances can be used. The current through the series circuit comprising resistors R6 and R7, the emitter-collector paths of transistors Q1 and Q2 and diode D1 is adjusted to a point just above the nonlinear region of the current-voltage characteristic of the diode D1 and just below the nonlinear region of the current-voltage characteristics of the base-emitter junctions of the power transistors Q3 and Q4. This adjustment is readily made by a proper selection of resistors R6 and R7. Under quiescent, i.e., under zero signal conditions, only an extremely small current flow exists though the diode D1 to establish a voltage drop thereacross which remains substantially constant even in the presence of superimposed signal currents. Consequently, the voltage between the base electrodes of power transistors Q3 and Q4 remains, at all times, substantially constant. Both alternating current and direct current feedback are supplied by a direct connection between the junction of resistors R3 and R4 and the emitter electrodes of the power transistors. The effect of this feedback will be described more fully with reference to FIG. 2. In addition to the overall feedback provided by the connection from the emitter electrodes of the power transistors, some local direct current feedback is also provided by resistors R6 and R7. This local feedback acts only under direct current conditions as all signal currents are bypassed by their shunting capacitors C3 and C4.

Figure 2:
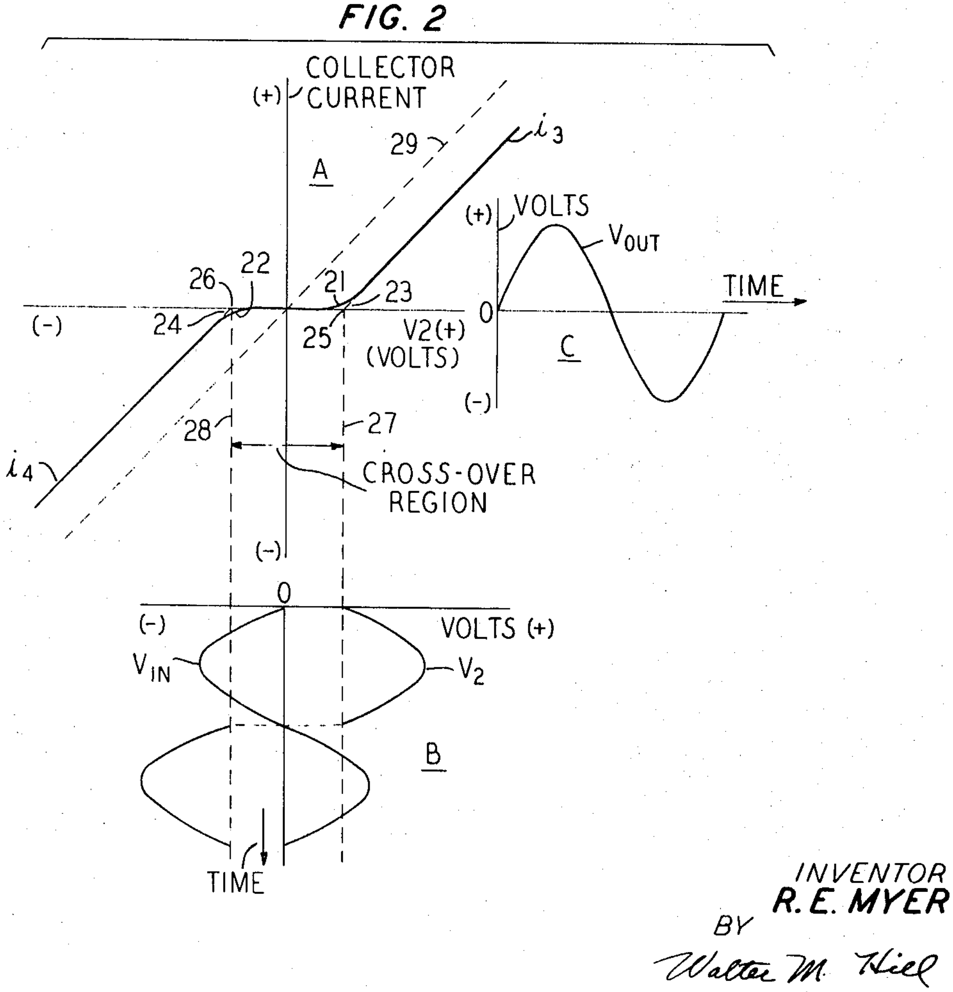
FIG. 2 shows some of the characteristics and waveforms of the circuit of FIG. 1.

In FIG. 2, the three portions, A, B and C, show some of the principal characteristics and waveforms of the circuit of FIG. 1. It is to be understood that these characteristics and waveforms are not to scale as arbitrary scale factors have been employed in each to better illustrate the principles of the invention. The characteristics of portion A show the signal currents $i_3$ and $i_4$ flowing in the collector electrodes of power transistors Q3 and Q4, respectively, plotted as a function of their base electrode voltages. The collector electrode currents normally have the substantially nonlinear regions 21 and 22 which follow the corresponding nonlinear regions of their base-emitter junctions. The effect of these nonlinear regions is eliminated by this invention by employing the principle of applicant's earlier U.S. Pat. 3,182,267 granted May 4, 1965. How this principle is used in the present invention will be described more fully later.

The signal voltage waveform $V_{in}$, shown in portion B of FIG. 2, is applied between input terminals 1 and 2 of FIG. 1 and the amplified replica of opposite phase V2 appearing at the collector electrodes of Q1 and Q2 is also shown in portion B of FIG. 2. The amplified output voltage $V_{out}$ appearing between output terminals 3 and 4 is shown in portion C of FIG. 2. It is again emphasized that the waveforms shown are not to scale.

As previously described, the base electrodes of transistors Q3 and Q4 are maintained at a substantially fixed voltage difference by the voltage drop across diode D1 so that the output from driver transistors Q1 and Q2 drive these base electrodes at the same signal voltage. When the input voltage is zero, the base electrode of transistor Q3 will be at a voltage approximately equal to a fixed fraction (generally about one-half) of the (+V) source voltage plus about one-half the voltage drop across diode D1 while the base electrode of transistor Q4 will be at a voltage approximately equal to the same fixed fraction of the source voltage less about one-half the voltage drop across diode D1. Since the emitter electrodes of both transistors are joined to the junction between resistors R3 and R4, they will be at about the same fixed fraction of the source voltage. The net base-emitter bias for each of the power transistors is, therefore, about one-half the voltage drop across diode D1. In the ideal case, this bias is too small to start flow of collector electrode current so, under zero input voltage conditions, neither power transistor passes any collector electrode current. In the practical case unavoidable dissymmetry is such that one of the power transistors, Q3 or Q4, will actually conduct a very small amount of base-emitter current which is sufficient to produce a minute amount of collector electrode current. This will provide enough direct current feedback to the junction of resistors R3 and R4 to automatically center the bias and equalize the current in the driver stage. When the signal voltage $V_{in}$ shown in portion B of FIG. 2 is applied between terminals 1 and 2 of FIG. 1, the first negative-going portion of the wave will increase conduction through the base-emitter junction of driver transistor Q1 and decrease it through the base-emitter junction of driver transistor Q2. This results in a positive-going amplified signal voltage V2 appearing on the base electrodes of both power transistors Q3 and Q4 to start conduction in the base-emitter junction of power transistor Q3 but leaving transistor Q4 cut off.

Advantage is taken of the principle of applicant's earlier patent, cited above, to linearize the output waveform. Without the use of this principle, the normally nonlinear current characteristic shown in portion A of FIG. 2 would cause considerable distortion in the output waveform. During quiescent or zero input conditions and also while the signal voltage is passing through zero, the base-emitter junction of transistor Q3 has a high impedance, thereby removing the load from the driver transistor Q1 to give it a correspondingly high voltage gain. As described in the earlier patent, this will cause the applied voltage between the base and emitter electrodes of transistor Q3 to sharply rise so that point 25 (the intersection of the linear extension 23 of the collector electrode current characteristic $i_3$ with the voltage axis) abruptly shifts to the origin. As this same effect occurs for power transistor Q4 during the start of the next half cycle of signal voltage, the entire crossover region between the dotted parallel lines 27, 28 passing through points 25 and 26 is effectively caused to collapse, thereby resulting in a combined characteristic represented by the dotted line 29 passing through the origin. This characteristic results from an effective translation of the linear portions of the current characteristics $i_3$ and $i_4$ and their extended linear regions 23 and 24, respectively. The amplified signal voltage V2 as shown in portion B can also be assumed to be shifted through the crossover region to appear as a continuous undistorted wave. The gain of the driver stage is sufficiently high in the crossover region that no perceptibly audible transient is evident in the output waveform.

As an example of a specific circuit design but not in any way limiting the invention to this example, an amplifier can be constructed in accordance with FIG. 1 to deliver one watt of essentially distortion free power directly to a loudspeaker of most any commercially available impedance without an output transformer if the following components are used:

| | |
|---|---|
| R1, R6, R7=1K | Q1=2N1305 |
| R2, R5=2K | Q2=2N1304 |
| R3, R4=10K | Q3=2N3567 |
| C1, C2=5μf. | Q4=2N3638 |
| C3, C4=100μf. | D1=1N4154 |
| C5=500μf. | |

An outstanding advantage of this invention resides in the fact that the resistors and capacitors may be of only nominal size with no critical tolerance requirements and that the transistors and diodes need not be matched. Moreover, the circuit remains operative over a wide range of supply voltages, the minimum supply voltage being determined by the voltage necessary to make diode D1 conductive and the maximum supply voltage being determined by the rating of the transistors, particularly Q3 and Q4. The maximum power output, however, varies with the power supply voltage.

Figure 3:
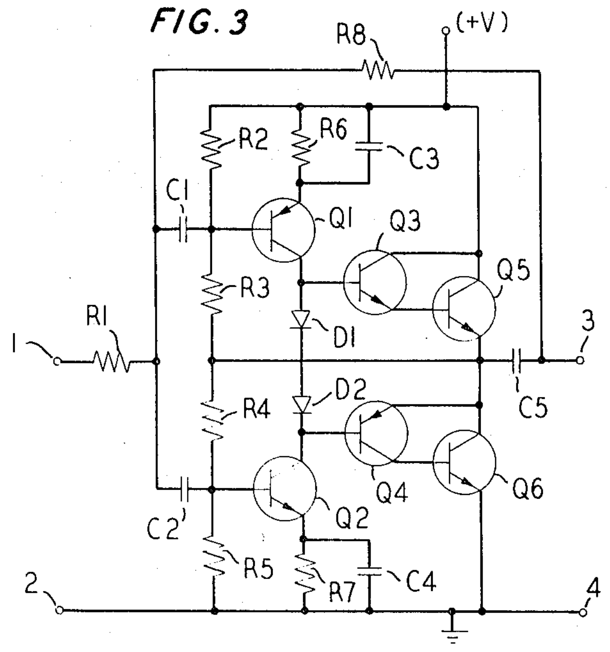
FIG. 3 discloses a circuit diagram of a different embodiment of the invention capable of a higher power output than that of the circuit of FIG. 1.

In FIG. 1 the power transistors Q3 and Q4 are complementary as are also the driver transistors Q1 and Q2. At the present time high power NPN silicon transistors have become available at a quite reaconable cost but PNP type transistors of comparable power are not so easily obtained. In order to take advantage of the higher power NPN transistors now available, the complementary transistors Q3 and Q4 may be coupled with a pair of NPN transistors Q5 and Q6, the latter being arranged as shown in FIG. 3 to operate as the power output transistors. The circuits of the driver stage comprising transistors Q1 and Q2 are identical to those shown in FIG. 1 except for the addition of a second diode D2 connected in series with diode D1. In the power stage, transistors Q3 and Q5 are connected to form the well known Darlington pair as described in U.S. Pat. 2,663,806 granted Dec. 22, 1953, to S. Darlington. Transistors Q4 and Q6, although of opposite types, are also connected in a circuit essentially equivalent to the well known Darlington pair. Transistors Q5 and Q6, as mentioned above, are the newer high power types, such as for example, the 2N3054 or the 2N3773 transistors. If the 2N3054 transistors are used, the amplifier can be made to deliver ten watts of essentially undistorted power while 100 watts may be delivered by the 2N3773 type transistors. An additional overall alternating current feedback loop comprising resistor R8 connected between the signal output terminal 3 and the junction between resistor R1 and the two capacitors C1 and C2 may be employed, although its use is optional.

Figure 4:
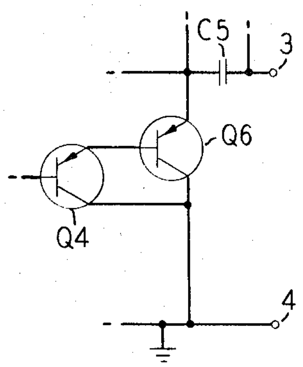
FIG. 4 is a fragmentary view of a portion of the circuit of FIG. 3 showing an alternative power transistor circuit arrangement.

In the event a high power type PNP transistor is developed at a reasonable cost which is complementary to the transistor Q5, it may be connected with transistor Q4 in the manner shown in the fragmentary circuit in FIG. 4. The relationship between this fragmentary circuit and that of FIG. 3 is obvious by comparison.

Figure 5:
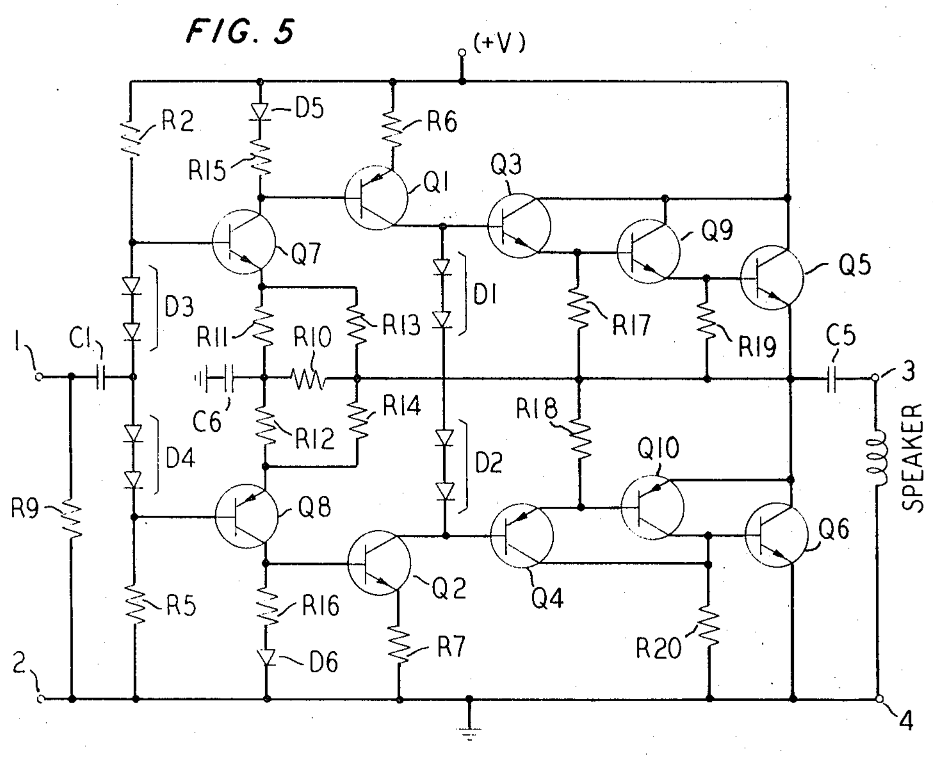
FIG. 5 shows a more elaborate circuit structure capable of higher power as well as still greater circuit stability.

The circuit of FIG. 5 also shows the driver stage comprising transistors Q1 and Q2 with their collector electrodes connected together through a plurality of diodes represented by diode groups D1 and D2 and their emitter electrodes connected in series with resistors R6 and R7 across the power supply in the same manner shown in FIGS. 1 and 3. The circuit differs, however, in some other respects in that a preamplifier comprising transistors Q7 and Q8 is also employed and each side of the power stage comprises three transistors connected after the manner disclosed in the above cited Darlington patent. In the present case, however, the bypass capacitors C3 and C4 have been removed from resistors R6 and R7, respectively, so as to deliberately introduce both alternating current and direct current local feedback in this stage.

The preamplifier stage comprising transistors Q7 and Q8 have their emitter electrodes connected together through a resistive network comprising resistors R10, R11, R12, R13 and R14. The feedback path from the output circuit of the power stage to this network provides both alternating current and direct current feedback as was true in the case of both FIGS. 1 and 3. The common junction of resistors R10, R11 and R12 is bypassed to ground for alternating currents by way of capacitor C6. The feedback path from the output circuit of the power stage is connected to the common junction of resistors R10, R13 and R14. The junction between resistors R11 and R13 is connected to the emitter electrode of transistor Q7 while the junction between resistors R12 and R14 is connected to the emitter electrode of transistor Q8. The collector electrode of transistor Q7 is connected to the positive pole of the power supply by way of the resistor R15 connected in series with the diode D5 while the collector electrode of transistor Q8 is connected to the grounded pole of the power supply by way of resistor R16 and diode D6. The collector electrodes of these two transistors are also respectively connected to the base electrodes of the driver stage transistors Q1 and Q2. The base electrodes of the preamplifier transistors Q7 and Q8 are connected together through a plurality of diodes represented by diode groups D3 and D4. Current is supplied to these diodes by way of resistor R2 connected between the positive pole of the source and diode group D3 and resistor R5 connected between diode group D4 and the grounded pole of the power source. The signal input terminal 1 is coupled to the junction between diode groups D3 and D4 by capacitor C1. Resistor R9 is connected between the signal input terminal 1 and the grounded input terminal 2.

In the power stage, transistors Q3, Q9 and Q5 are connected essentially identical with FIG. 9 of the above-cited Darlington patent, the exception being that the signal output is obtained from the emitter electrode of transistor Q5 instead of from the common collector electrode junction. A similar circuit arrangement is also shown for transistors Q4, Q10 and Q6 with the single exception that the power output transistor Q6 is of the NPN type instead of the PNP type shown for their companion transistors Q4 and Q10. This difference in transistor type is for the same reason that the high power transistor Q6 was used in FIG. 3 and, of course, could be converted into the more conventional Darlington circuit in the manner disclosed in FIG. 4 providing a suitable high power PNP transistor is developed which is complementary to transistor Q5. Resistors R17 and R18 are connected in series between the emitter electrodes of transistors Q3 and Q4 and the junction between these resistors is connected to the feedback lead going to the common junction of resistors R10, R13 and R14. Resistor R19 also connects the feedback lead to the emitter electrode of transistor Q9 and resistor R20 connects the collector electrodes of transistors Q4 and Q10 to the grounded negative pole of the power source. A speaker coil is shown connected between the signal output terminal 3 and the grounded output terminal 4.

From the foregoing description, it will be evident that in each of the circuits of FIGS. 1, 3 and 5 the power stage transistors have their emitter-collector paths connected in series directly across the two poles of the power supply. In FIG. 5, for example, the emitter electrode of transistor Q5 is connected to the collector electrode of transistor Q6, thereby connecting the collector-emitter paths of the two transistors in series and, since the collector electrode of transistor Q5 is connected directly to the ungrounded positive pole of the power supply and the emitter electrode of transistor Q6 is connected to the grounded terminal of the same supply, the two emitter-collector paths through the power transistors are connected in series directly across the power supply. If a PNP type transistor, complementary to transistor Q5, is connected in place of transistor Q6 in the manner disclosed in FIG. 4, the electrodes of the two power transistors which will be connected together will be the two emitter electrodes rather than the emitter and collector electrodes, respectively, as shown in FIG. 5. In every case, however, the junction between the two electrodes in the power stage which are directly connected together is coupled to the signal output terminal 3 by way of capacitor C5 and this junction is also conductively connected to the driver stage to provide both direct current and alternating current feedback.

The outstanding advantage of the circuit of FIG. 5 resides not only in the high power output which it can deliver but also in the improved feedback circuit which provides more precise bias centering for the transistors of the driver stage. As described with reference to FIG. 1, the current through transistors Q1 and Q2 of both FIGS. 3 and 5 are adjusted until the diodes D1 and D2 become conductive at a point just above the nonlinear region of their current-voltage characteristic and just below the nonlinear region of the current voltage characteristic of the base-emitter junctions of transistors Q5 and Q6. Under these conditions, a very slight current may flow through the base-emitter junctions of one side of the power stage, for example, through the base-emitter junctions of transistors Q3, Q9 and Q5. By reason of the very high direct current feedback provided by this circuit, the collector electrode currents in both the preamplifier and the driver stages will be exceedingly small. Also, since the bias provided by diodes D1 and D2 permits only a very small current through the base-emitter junctions of the transistors in the power stage, too small to permit their collector electrodes to conduct more than only a very minute current, there will be no appreciable power loss in the driver stage under quiescent conditions. The circuit, therefore, is highly efficient and introduces no perceptible crossover distortion because of the very strong action of the alternating current feedback which effectively collapses the crossover region in the manner previously described with reference to FIG. 2.

From the illustrative examples given embodying the principles of this invention, it will be quite evident that vaious modifications may be made without departing from the scope of this invention.

What is claimed is:

1. A class B transistor power amplifier circuit comprising a signal input terminal, a signal output terminal, a source of direct current having two opposite poles, a driver stage and a power stage connected for push-pull operation, each stage including a plurality of transistors, each transistor having an emitter electrode, a base electrode and a collector electrode; said driver stage comprising two transistors of complementary types with their collector electrodes conductively connected together, two resistors respectively connecting their emitters to said opposite poles and their bases coupled to said input terminal; said power stage comprising a series circuit formed by the paths between the collector and emitter electrodes of two power transistors, said series circuit being connected between the two opposite poles of said direct current source, the two electrodes of said power transistors which are connected directly together in said series circuit being coupled to said signal output terminal, the base electrodes of said power transistors being respectively conductively coupled to the collector electrodes of said two transistors in the driver stage, a direct current path between the base electrodes of said two transistors in the driver stage and the two electrodes of said power transistors which are directly connected together for providing both direct current and alternating current feedback; and a preamplifier stage comprising a pair of complementary type transistors, each having an emitter electrode, a collector electrode and a base electrode, said emitter electrodes each being joined through resistive means to the two electrodes of said power transistors which are directly connected together in said series circuit, said base electrodes being connected together through at least two series-connected diodes, means coupling said diodes to said signal input terminal, and means directly connecting said collector electrodes to the base electrodes, respectively, of said driver stage.

2. A class B transistor power amplifier circuit comprising a signal input terminal, a signal output terminal a source of direct current having two opposite poles, a driver stage and a power stage connected for push-pull operation, each stage including a plurality of transistors, each transistor having an emitter electrode, a base electrode and a collector electrode; and said driver stage comprising two transistors of complementary types with at least one diode directly connected between their collectors, two resistors respectively connecting their emitters to said opposite poles and their bases coupled to sair input terminal; said power stage comprising a series circuit formed by the paths between the collector and emitter electrodes of two power transistors, said series circuit being connected between the two opposite poles of said direct current source, the two electrodes of said power transistors which are connected directly together in said series circuit being coupled to said signal output terminal, the base electrodes of said power transistors being respectively conductively coupled to the collector electrodes of said two transistors in the driver stage; a direct current path between the base electrodes of said two transistors in the driver stage and the two electrodes of said power transistors which are directly connected together for providing both direct current and alternating current feedback; and a preamplifier stage comprising a pair of complementary type transistors, each having an emitter electrode, a collector electrode and a base electrode, said emitter electrodes each being joined through resistive means to the two electrodes of said power transistors which are directly connected together in said series circuit, said base electrodes being connected together through at least two series-connected diodes, means coupling said diodes to said signal input terminal, and means directly connecting said collector electrodes to the base electrodes, respectively, of said driver stage.

3. A class B transistor power amplifier circuit comprising a signal input terminal, a signal output terminal, a source of direct current having two opposite poles, a driver stage and a power stage connected for push-pull operation, each stage including a plurality of transistors, each transistor having an emitter electrode, a base electrode and a collector electrode; said driver stage comprising two transistors of complementary types with at least one diode directly connected between their collectors, two resistors respectively connecting their emitters to said opposite poles and their bases coupled to said signal input terminal; said power stage comprising two power transistors connected for class B push-pull operation with the paths between their collector and emitter electrodes connected in a series circuit between said two opposite poles, a conductive path coupling the junction between their base and emitter electrodes to the collector electrodes, respectively, of the two transistors of said driver stage, said junctions comprising essentially the sole effective load for said driver transistors, whereby the voltage gain of each driver transistor increases as the resistance of the base-emitter junction of its associated power transistor increases; and a preamplifier stage comprising a pair of complementary type transistors, each having an emitter electrode, a collector electrode and a base electrode, said emitter electrodes each being joined through resistive means to the two electrodes of said power transistors which are directly connected together in said series circuit, said base electrodes being connected together through at least two series-connected diodes, means coupling said diodes to said signal input terminal, and means directly connecting said collector electrodes to the base electrodes respectively, of said driver stage.

References Cited

UNITED STATES PATENTS

| | | | |
|---|---|---|---|
| 2,994,834 | 8/1961 | Jones | 330—13 |
| 3,077,566 | 2/1963 | Vosteen. | |
| 3,271,691 | 9/1966 | Hendon et al. | 330—17 |
| 3,375,455 | 3/1968 | Motta | 330—17 X |
| 3,434,067 | 3/1969 | Eckelmann | 330—19 X |

ROY LAKE, Primary Examiner

J. B. MULLINS, Assistant Examiner

U.S. Cl X.R.

330—15, 17, 28